(12) United States Patent
Ha et al.

(10) Patent No.: US 10,998,350 B2
(45) Date of Patent: May 4, 2021

(54) DISPLAY DEVICE

(71) Applicant: Samsung Display Co., Ltd., Yongin-Si (KR)

(72) Inventors: Jinjoo Ha, Hwaseong-si (KR); Basrur Veidhes, Yongin-si (KR); Yangho Bae, Seoul (KR); Changil Tae, Seoul (KR)

(73) Assignee: Samsung Display Co., Ltd.

( * ) Notice: Subject to any disclaimer, the term of this patent is extended or adjusted under 35 U.S.C. 154(b) by 29 days.

(21) Appl. No.: 16/396,340

(22) Filed: Apr. 26, 2019

(65) Prior Publication Data

US 2019/0363110 A1 Nov. 28, 2019

(30) Foreign Application Priority Data

May 24, 2018 (KR) .................. 10-2018-0058718

(51) Int. Cl.
*H01L 27/12* (2006.01)
*G02F 1/1362* (2006.01)
*G02F 1/1368* (2006.01)

(52) U.S. Cl.
CPC ........ *H01L 27/1248* (2013.01); *G02F 1/1368* (2013.01); *G02F 1/136227* (2013.01); *G02F 2001/136222* (2013.01)

(58) Field of Classification Search
CPC .......... H01L 27/1248; G02F 1/136227; G02F 1/1368; G02F 2001/136222; G02F 1/1362
See application file for complete search history.

(56) References Cited

U.S. PATENT DOCUMENTS

| 8,253,891 | B2 * | 8/2012 | Yu ................. G02F 1/136209 349/106 |
|---|---|---|---|
| 8,785,810 | B2 | 7/2014 | Hyun et al. |
| 8,916,876 | B2 | 12/2014 | Jeon et al. |
| 9,030,620 | B2 | 5/2015 | Chae et al. |
| 9,214,498 | B2 | 12/2015 | Yun et al. |
| 9,570,481 | B2 | 2/2017 | Lee et al. |

FOREIGN PATENT DOCUMENTS

| KR | 10-2012-0043850 A | 5/2012 |
|---|---|---|
| KR | 10-1194855 B1 | 10/2012 |
| KR | 10-2014-0145723 A | 12/2014 |
| KR | 10-1503122 B1 | 3/2015 |
| KR | 10-2015-0094815 A | 8/2015 |
| KR | 10-2016-0053196 A | 5/2016 |
| KR | 10-1739384 B1 | 5/2017 |

* cited by examiner

*Primary Examiner* — David Vu
(74) *Attorney, Agent, or Firm* — Innovation Counsel LLP

(57) ABSTRACT

Provided is a display device including a display panel including a pixel including a first sub-pixel and a second sub-pixel, and a capping layer. The first sub-pixel includes a first pixel transistor disposed on a first pixel circuit area, a first pixel electrode disposed on a first pixel electrode area, a first color filter disposed on the first pixel circuit area while covering the first pixel transistor, and a second color filter disposed on the first pixel electrode area and the first pixel circuit area. The capping layer covers the first color filter and the second color filter, and a first opening is defined in one area of the capping layer, which overlaps the second color filter on a plane.

20 Claims, 11 Drawing Sheets

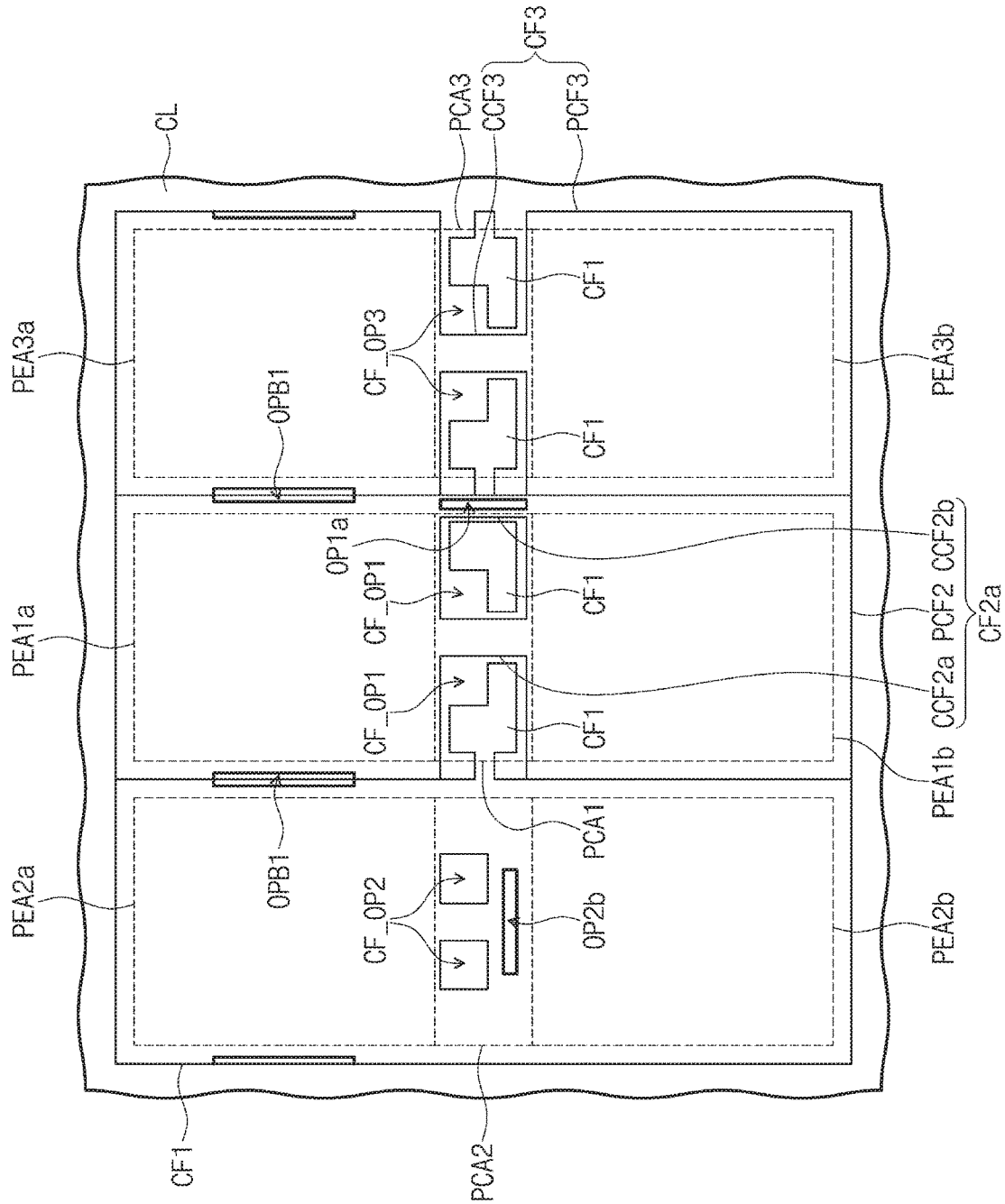

DISPLAY DEVICE

CROSS-REFERENCE TO RELATED APPLICATIONS

This U.S. non-provisional patent application claims priority under 35 U.S.C. § 119 of Korean Patent Application No. 10-2018-0058718, filed on May 24, 2018, the entire contents of which are hereby incorporated by reference.

BACKGROUND

The present disclosure herein relates to a display device having improved reliability.

A liquid crystal display device includes two substrates, which face each other, with a liquid crystal layer disposed therebetween. The liquid crystal display device applies a voltage to an electric-field generation electrode (e.g., a pixel electrode or a common electrode) to generate an electric field in the liquid crystal layer. Accordingly, an orientation direction of liquid crystal molecules of the liquid crystal layer is determined, and an image is displayed by controlling polarization of incident light.

A gas may be generated from a portion of layers constituting the liquid crystal display device. When the generated gas is not fully discharged during a manufacturing process, the gas may be discharged after the device is manufactured, and, as a result, a defect, in which the liquid crystal layer is not filled into an active area due to the discharged gas, may be generated.

SUMMARY

The present disclosure provides a display device having improved reliability.

An embodiment of the inventive concept provides a display device including: a display panel including: a pixel including a first sub-pixel and a second sub-pixel; and a capping layer. The first sub-pixel includes: a first pixel transistor disposed on a first pixel circuit area; a first pixel electrode disposed on a first pixel electrode area; a first color filter disposed on the first pixel circuit area while covering the first pixel transistor; and a second color filter disposed on the first pixel electrode area and the first pixel circuit area and being different from the first color filter. The capping layer covers the first color filter and the second color filter, and a first opening is defined in one area of the capping layer, which overlaps the second color filter on a plane.

In an embodiment, the second sub-pixel may include: a second pixel transistor disposed on a second pixel circuit area; a second pixel electrode disposed on a second pixel electrode area; and a third color filter disposed on the second pixel circuit area and the second pixel electrode area while covering the second pixel transistor.

In an embodiment, the first color filter may be the same as the third color filter.

In an embodiment, each of the first color filter and the third color filter may be a red color filter.

In an embodiment, the second color filter may be disposed around the first color filter on the first pixel circuit area, and non-overlap the first pixel transistor on the plane.

In an embodiment, each of the first pixel electrode area and the first pixel transistor may be provided in plurality, and the first pixel circuit area may be disposed between the first pixel electrode areas. The second color filter may include pixel color filters and at least one connecting color filter connecting the pixel color filters, and the pixel color filters may be disposed on the first pixel electrode areas, and the connecting color filter may be disposed on the first pixel circuit area.

In an embodiment, the first opening may overlap one of the pixel color filters.

In an embodiment, the first opening may be provided in plurality, and the first openings may overlap the pixel color filters.

In an embodiment, the first opening may overlap the connecting color filter.

In an embodiment, the connecting color filter may be provided in plurality, and the first pixel transistor may be disposed between the connecting color filters on the plane.

In an embodiment, the display panel may further include a cover pattern covering the first opening.

In an embodiment, the second color filter may be a green color filter.

In an embodiment, the pixel may further include a third sub-pixel. The third sub-pixel may include: a third pixel transistor disposed on a third pixel circuit area; a third pixel electrode disposed on a third pixel electrode area; and a fourth color filter disposed on the third pixel electrode area and the third pixel circuit area. The first color filter may be also disposed on the third pixel circuit area while covering the third pixel transistor. The capping layer may cover the first color filter and the fourth color filter, and a second opening may be defined in one area of the capping layer, which overlaps the fourth color filter on the plane.

In an embodiment, the fourth color filter may be a blue color filter.

In an embodiment of the inventive concept, a display device includes: a display panel including: a pixel including a red sub-pixel, a blue sub-pixel, and a green sub-pixel; and a capping layer. Each of the red, blue, and green sub-pixels includes a pixel transistor disposed on a pixel circuit area and a pixel electrode disposed on a pixel electrode area, and the pixel transistor is covered by a red color filter, a blue color filter is disposed on a first peripheral portion of the pixel transistor on the pixel circuit area of the blue sub-pixel and the pixel electrode area of the blue sub-pixel, and a green color filter is disposed on a second peripheral portion of the pixel transistor on the pixel circuit area of the green sub-pixel and the pixel electrode area of the green sub-pixel, and openings are provided in the capping layer, and the openings overlap the red color filter, the green color filter, and the blue color filter, respectively.

In an embodiment, at least one of the openings may overlap the first peripheral portion on a plane, and at least one of the openings may overlap the second peripheral portion on the plane.

In an embodiment, at least one of the openings may overlap a third peripheral portion of the pixel transistor on the pixel circuit area of the red sub-pixel.

In an embodiment, at least one of the openings may overlap two color filters, which are adjacent to each other, of the red color filter, the blue color filter, and the green color filter.

In an embodiment, the pixel electrode area of each of the red sub-pixel, the blue sub-pixel, and the green sub-pixel may be provided in plurality, and the pixel circuit area may be disposed between pixel electrode areas. The blue color filter may include blue pixel color filters disposed on the pixel electrode areas of the blue sub-pixel and a blue connecting color filter disposed on the first peripheral portion. The green color filter may include green pixel color filters disposed on the pixel electrode areas of the green sub-pixel and a green connecting color filter disposed on the second peripheral portion. The blue pixel color filters may be connected by the blue connecting color filter, and the green pixel color filters may be connected by the green connecting color filter.

In an embodiment, the green connecting color filter may be provided in plurality, and the green pixel color filters may be connected by the plurality of green color filters.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 10 is a plan view illustrating a color filter and a capping layer according to an embodiment of the inventive concept.

DETAILED DESCRIPTION

Figure 1:
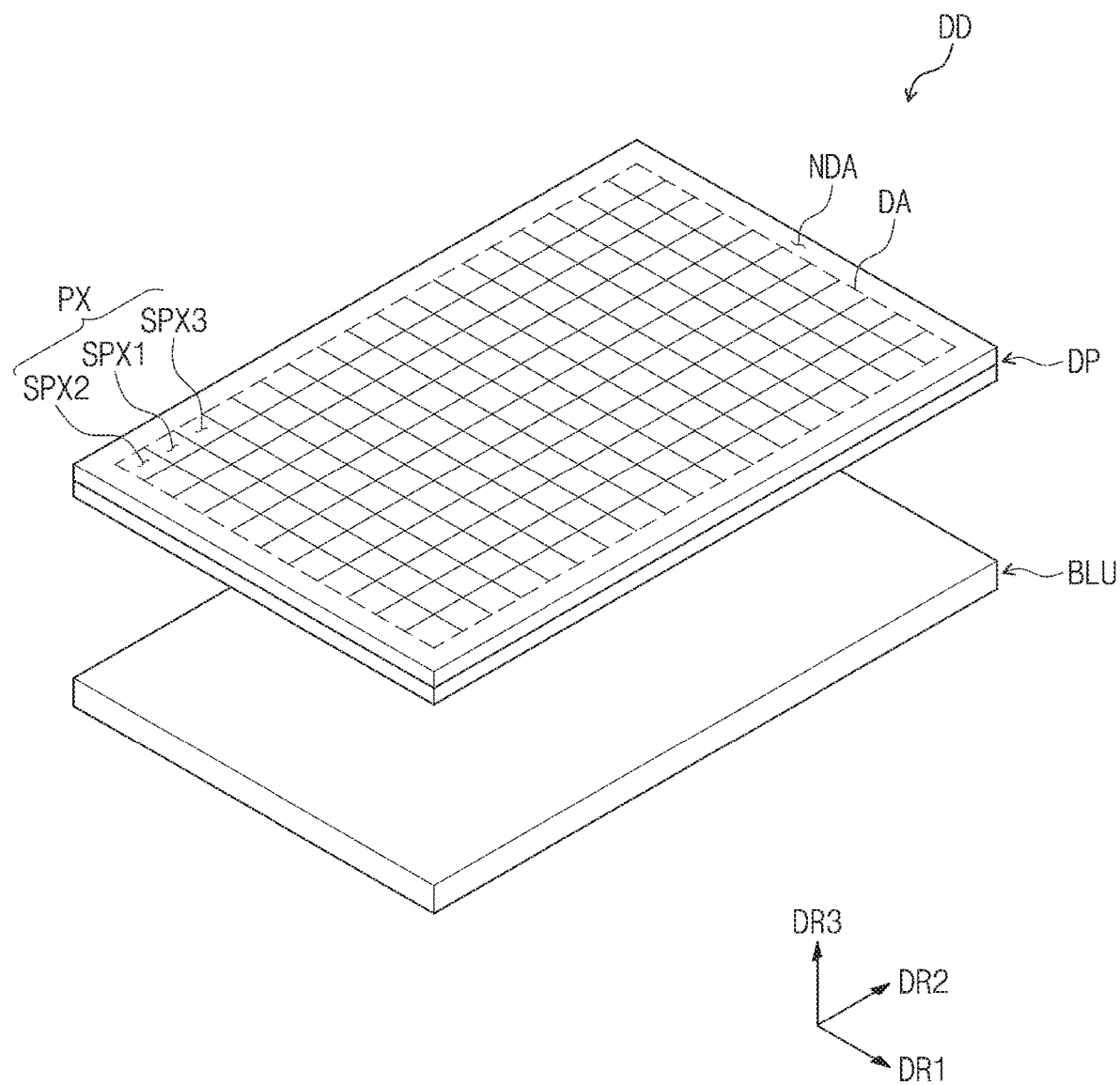
FIG. 1 is a schematic perspective view illustrating a display device according to an embodiment of the inventive concept.

Hereinafter, embodiments of the inventive concept will be described with reference to the accompanying drawings. In this specification, it will also be understood that when one component (or region, layer, portion) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims.

The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

FIG. 1 is a schematic perspective view illustrating a display device DD according to an embodiment of the inventive concept.

Referring to FIG. 1, the display device DD may be used for a large-sized electronic device such as a television, a monitor, or an outdoor advertisement board as well as a small and medium sized electronic device such as a personal computer, a notebook computer, a personal digital terminal, a navigation unit for a vehicle, a game console, a portable electronic device, and a camera. Also, these are only exemplary embodiments, and other electronic devices may be adaptable as long as they are not deviated from the concept of the present disclosure.

The display device DD may include a display panel DP and a backlight unit BLU.

The display panel DP according to the embodiment may be a light receiving type display panel. The display panel DP may provide an image by transmitting or blocking provided light. Although the display panel DP may be a liquid crystal display panel, the embodiment of the inventive concept is not limited thereto.

The display panel DP may have a plate shape having a plane defined by a first direction DR1 and a second direction DR2. For example, a display area DA of the display device DD may have a rectangular shape, and a non-display area NDA may surround the display area DA. However, the embodiment of the inventive concept is not limited thereto. For example, the shapes of the display area DA and the non-display area NDA may be relatively designed.

The display panel DP may generate an image in response to inputted image data and provide the generated image to the front surface. For example, the display panel DP may provide the generated image in a third direction DR3.

Although the display device DD has a flat shape in FIG. 1, the embodiment of the inventive concept is not limited thereto. In another embodiment of the inventive concept, the display device may be a curved display device. For example, the display device DD may be a curved display device that is overall bent in a concave or convex manner when a user sees the liquid crystal display device DD. Also, the display device DD may be a display device of which only a portion is bent.

The display panel DP may include a pixel PX. The pixel PX may include a plurality of sub-pixels SPX1, SPX2, and SPX3. The pixel PX may include a first sub-pixel SPX1, a second sub-pixel SPX2, and a third sub-pixel SPX3. For example, the first sub-pixel SPX1 may be a green sub-pixel, the second sub-pixel SPX2 may be a red sub-pixel, and the third sub-pixel SPX3 may be a blue sub-pixel. In another embodiment of the inventive concept, the pixel PX may include two sub-pixels or four or more sub-pixels.

Although the second sub-pixel SPX2, the first sub-pixel SPX1, and the third sub-pixel SPX3 are sequentially arranged in the second direction DR2 in FIG. 1, the embodiment of the inventive concept is not limited thereto. For example, the first to third sub-pixels SPX1, SPX2, and SPX3 may be variously changed in arrangement order.

The backlight unit BLU may be disposed below the display panel DP. The backlight unit BLU provides light to the display panel DP. The display panel DP may display an image by controlling a transmission amount of light generated from the backlight unit BLU.

Figure 2:
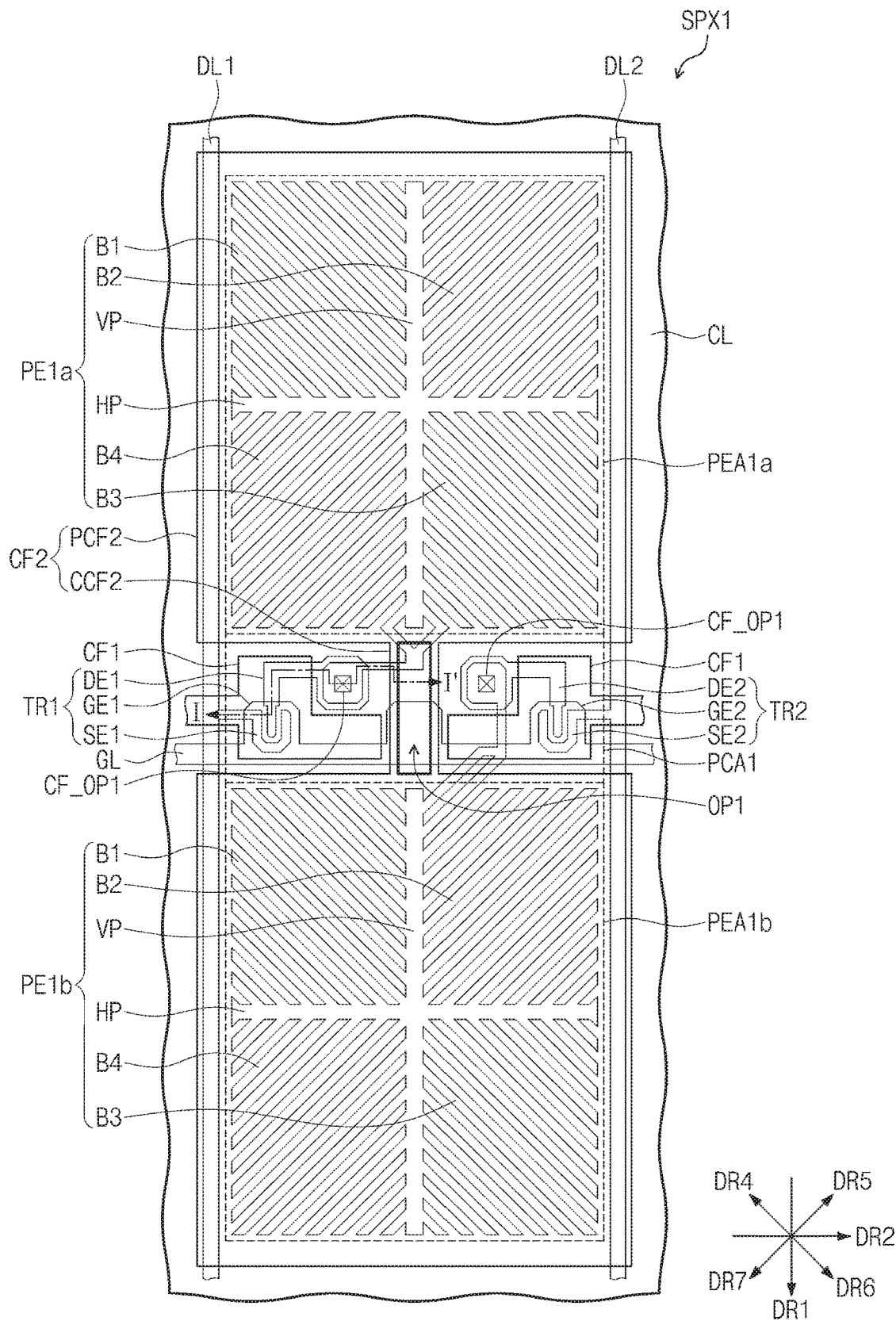
FIG. 2 is an enlarged plan view illustrating a first sub-pixel according to an embodiment of the inventive concept.
Figure 3A:
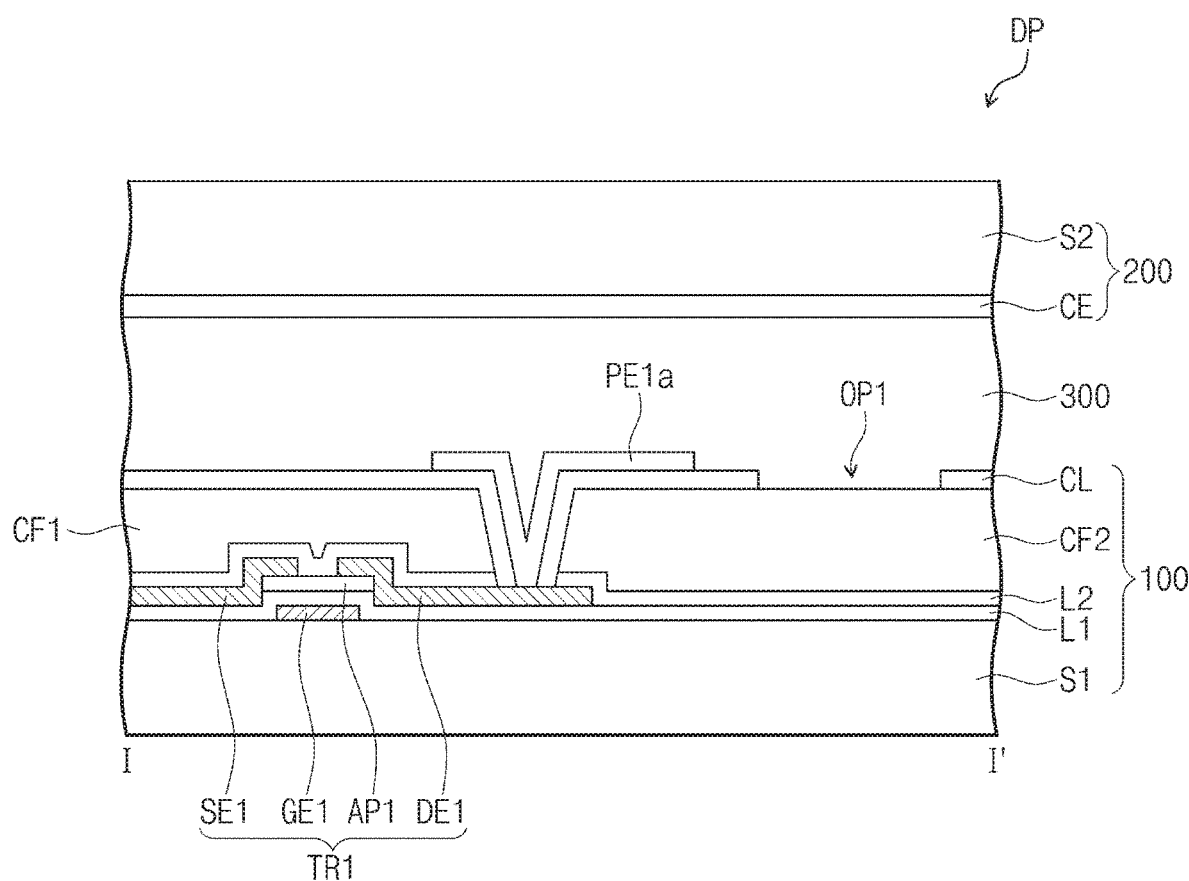
FIG. 3A is a cross-sectional view taken along line I-I' of FIG. 2.

FIG. 2 is an enlarged plan view illustrating the first sub-pixel SPX1 according to an embodiment of the inventive concept. FIG. 3A is a cross-sectional view taken along line I-I' in FIG. 2.

Referring to FIGS. 2 and 3A, the display panel DP may include a first substrate 100, a second substrate 200, and a liquid crystal layer 300.

The first substrate 100 may include a plurality of pixel electrode areas and a plurality of pixel circuit areas. FIG. 2 illustrates first pixel electrode areas PEA1a and PEA1b and a first pixel circuit area PCA1, on which the first sub-pixel SPX1 is disposed The first pixel circuit area PCA1 may be disposed between the two first pixel electrode areas PEA1a and PEA1b. For convenience of description, from among the first pixel electrode areas PEA1a and PEA1b, the first pixel electrode area PEA1a disposed above the first pixel circuit area PCA1 on a plane is referred to as a first high pixel electrode area PEA1a. The first pixel electrode area PEA1b disposed below the first pixel circuit area PCA1 on the plane is referred to as a first low pixel electrode area PEA1b.

According to an embodiment of the inventive concept, the first sub-pixel SPX1 may include a first pixel transistor TR1, a second pixel transistor TR2, first pixel electrodes PE1a and PE1b, a first color filter CF1, and a second color filter CF2. The embodiment of the inventive concept is not limited to the structure of the first sub-pixel SPX1 in FIG. 2. For example, in another embodiment of the inventive concept, the first sub-pixel SPX1 may include one pixel transistor, one pixel electrode, a first color filter CF1, and a second color filter CF2.

The first pixel transistor TR1 and the second pixel transistor TR2 may be disposed on the first pixel circuit area PCA1. The first pixel electrode PE1a may be disposed on the first high pixel electrode area PEA1a, and the first pixel electrode PE1b may be disposed on the first low pixel electrode area PEA1b. The first pixel electrode PE1a disposed on the first high pixel electrode area PEA1a is referred to as a first high pixel electrode PE1a, and the first pixel electrode PE1b disposed on the first low pixel electrode area PEA1b is referred to as a first low pixel electrode PE1b.

The first pixel transistor TR1 may include a first control electrode GE1, a first input electrode SE1, a first output electrode DE1, and a first semiconductor pattern AP1. The second pixel transistor TR2 may include a second control electrode GE2, a second input electrode SE2, a second output electrode DE2, and a second semiconductor pattern (not shown).

The first pixel transistor TR1 may be electrically connected to the first high pixel electrode PE1a, a gate line GL, and a first data line DL1. The second pixel transistor TR2 may be electrically connected to the first low pixel electrode PE1b, the gate line GL, and a second data line DL2.

The first control electrode GE1 is connected to the gate line GL, the first input electrode SE1 is connected to the first date line DL1, and the first output electrode DE1 is connected to the first high pixel electrode PE1a. The second control electrode GE2 is connected to the gate line GL, the second input electrode SE2 is connected to the second date line DL2, and the second output electrode DE2 is connected to the first low pixel electrode PE1b.

In the embodiment, the first pixel transistor TR1 and the second pixel transistor TR2 may be connected to the same gate line GL and connected to different data lines DL1 and DL2. Accordingly, the first sub-pixel SPX1 may be driven by one gate line GL and two data lines DL1 and DL2. However, the embodiment of the inventive concept is not limited thereto. For example, the first sub-pixel SPX1 may be driven by two gate lines and one data line, two gate lines and two data lines, or one gate line and one date line.

Openings CF_OP1, in which the color filters are not disposed, may be defined to connect the first pixel electrodes PE1a and PE1b of the first sub-pixel SPX1 to the first and second pixel transistors TR1 and TR2. The openings CF_OP1 may correspond to an area in which the first and second color filters CF1 and CF2 are not provided. In FIG. 2, the first color filter CF1 and the second color filter CF2 are shown as being spaced apart from the openings CF_OP1. However, each of the first color filter CF1 and the second color filter CF2 is provided extending to a region adjacent to the openings CF_OP1, and may define the openings CF_OP1.

FIG. 3A illustrates a first base substrate S1, the first pixel transistor TR1, first and second insulation layers L1 and L2, the first color filter CF1, the second color filter CF2, a capping layer CL, and the first high pixel electrode PE1a of the first substrate 100.

The first base substrate S1 may contain an insulating material. The first base substrate S1 may be optically transparent. Light generated from the backlight unit BLU (refer to FIG. 1) disposed below the first base substrate S1 may transmit through the first base substrate S1 and be easily arrived to the liquid crystal layer 300. For example, the first base substrate S1 may include a glass substrate or a plastic substrate.

The first control electrode GE1 may be disposed on the first base substrate S1. The first insulation layer L1 may be disposed on the first control electrode GE1 and the second control electrode GE2. The first insulation layer L1 may cover the first and second control electrodes GE1 and GE2. The first semiconductor pattern AP1 may be disposed on the first insulation layer L1. The first semiconductor pattern AP1 may be spaced apart from the first control electrode GE1 on a cross-section.

The first semiconductor pattern AP1 may contain a semiconductor material. For example, the semiconductor material may include one of amorphous silicon, polycrystalline silicon, monocrystalline silicon, an oxide semiconductor, and a compound semiconductor.

The first input electrode SE1 and the first output electrode DE1 may be disposed on the first semiconductor pattern AP1. Although not shown in FIG. 3A, the second pixel transistor TR2 may have the same lamination structure as the first pixel transistor TR1.

The second insulation layer L2 may be disposed on the first input electrode SE1 and the first output electrode DE1. The second insulation layer L2 may cover the first input electrode SE1 and the first output electrode DE1.

The first color filter CF1 and the second color filter CF2 may be disposed on the second insulation layer L2. The first color filter CF1 may be a red color filter, and the second color filter CF2 may be a green color filter.

The first color filter CF1 may be disposed on the first pixel circuit area PCA1. For example, the first color filter CF1 may be disposed on the first pixel transistor TR1 and the second pixel transistor TR2. The second color filter CF2 may be disposed on the first pixel circuit area PCA1, the first high pixel electrode area PEA1$a$, and the first low pixel electrode area PEA1$b$.

The second color filter CF2 may include pixel color filters PCF2 and a connecting color filter CCF2. One of the pixel color filters PCF2 may be disposed on the first high pixel electrode area PEA1$a$, e.g., may be disposed below the first high pixel electrode PE1$a$. The other of the pixel color filters PCF2 may be disposed on the first low pixel electrode area PEA1$b$, e.g., may be disposed below the first low pixel electrode PE1$b$. The pixel color filters PCF2, which are green color filters, may provide green light through the first sub-pixel SPX1.

The connecting color filter CCF2 may connect the pixel color filters PCF2 to each other. The connecting color filter CCF2 may be disposed on the first pixel circuit area PCA1. The connecting color filter CCF2 may be disposed on a peripheral portion of the first and second pixel transistors TR1 and TR2.

When light in a blue wavelength region is incident into each of the first and second pixel transistors TR1 and TR2, a leakage current may be generated in each of the first and second pixel transistors TR1 and TR2 due to the light in the blue wavelength region, and a threshold voltage may be shifted. Image quality of the display device DD (refer to FIG. 1) may be reduced by the phenomena of the generation of the leakage current in the first and second pixel transistors TR1 and TR2 and the shift of the threshold voltage.

According to an embodiment of the inventive concept, the first color filter CF1 may be a red color filter. Accordingly, the first color filter CF1 may allow light in a red wavelength region to transmit therethrough and block light in a different wavelength region. For example, the first color filer CF1 may block light in the blue wavelength region. Accordingly, the first color filter CF1 may block light in the blue wavelength region of light incident from the outside of the display device DD (refer to FIG. 1) and light in the blue wavelength region of light re-incident by being reflected due to a difference in refractive index for each layer. Accordingly, the phenomena of the generation of the leakage current in each of the first and second pixel transistors TR1 and TR2 due to the light in the blue wavelength region and the shift of the threshold voltage may be prevented, and, as a result, the image quality of the display device DD (refer to FIG. 1) may be prevented.

The capping layer CL may be disposed on the first color filter CF1 and the second color filter CF2. The capping layer CL may contain an inorganic material. For example, the capping layer CL may contain a silicon nitride or a silicon oxide.

A first opening OP1 is defined in the capping layer CL. The first opening OP1 may expose a component disposed below the capping layer CL. The first opening OP1 may overlap the second color filter CF2 on a plane. For example, the first opening OP1 may be disposed on the first pixel circuit area PCA1 and overlap the connecting color filter CCF2.

A gas may be generated from the second color filter CF2 during a process of manufacturing the display panel DP. When the gas generated from the second color filter CF2 is not fully discharged before the liquid crystal layer 300 is filled with liquid crystal molecules, as the gas generated from the second color filter CF2 may be discharged after the liquid crystal layer 300 is filled, a defect, in which the liquid crystal layer 300 is not completely filled in the first high pixel electrode area PEA1$a$ or the first low pixel electrode area PEA1$b$, may be generated.

According to an embodiment of the inventive concept, the second color filter CF2 includes the connecting color filter CCF2, and the first opening OP1 is defined in one area of the capping layer CL, which overlaps the second color filter CF2. Accordingly, the gas generated from the second color filter CF2 may be discharged through the first opening OP1. As a result, the defect, in which the liquid crystal layer 300 is not completely filled in the first high pixel electrode area PEA1$a$ or the first low pixel electrode area PEA1$b$, may be prevented from being generated. Accordingly, the display device DD (refer to FIG. 1) may have improved product reliability.

The first high pixel electrode PE1$a$ or the first low pixel electrode PE1$b$ may be disposed on the capping layer CL. The first high pixel electrode PE1$a$ may be electrically connected to the first output electrode DE1 of the first pixel transistor TR1, and the first low pixel electrode PE1$b$ may be electrically connected to the second output electrode DE2 of the second pixel transistor TR2.

Although the first high pixel electrode PE1$a$ and the first low pixel electrode PE1$b$ have the same size in FIG. 2, the embodiment of the inventive concept is not limited thereto. For example, the first high pixel electrode PE1$a$ has a size less than the first low pixel electrode PE1$b$.

Each of the first high pixel electrode PE1$a$ and the first low pixel electrode PE1$b$ may include a vertical electrode VP, a horizontal electrode HP, first branch electrodes B1, second branch electrodes B2, third branch electrodes B3, and fourth branch electrodes B4. The vertical electrode VP, the horizontal electrode HP, the first branch electrodes B1, the second branch electrodes B2, the third branch electrodes B3, and the fourth branch electrodes B4 may be connected to each other to form one pixel electrode.

The vertical electrode VP extends in the first direction DR1, and the horizontal electrode HP extends in the second direction DR2. Each of the first branch electrodes B1, the second branch electrodes B2, the third branch electrodes B3, and the fourth branch electrodes B4 may extend from the vertical electrode VP or the horizontal electrode HP. Each of the first branch electrodes B1 extends in a fourth direction DR4, each of the second branch electrodes B2 extends in a fifth direction DR5, each of the third branch electrodes B3 extends in a sixth direction DR6, and each of the fourth branch electrodes B4 extends in a seventh direction DR7.

Each of the second sub-pixel SPX2 (refer to FIG. 1) and the third sub-pixel SPX3 (refer to FIG. 1) may have a structure similar to that of the first sub-pixel SPX1. For example, each of the second sub-pixel SPX2 and the third sub-pixel SPX3 may have the substantially same structure as that of the first sub-pixel SPX1 except for the first and second color filters CF1 and CF2. Accordingly, description regarding a detailed structure of each of the second sub-pixel SPX2 and the third sub-pixel SPX3 will be omitted, and a color filter of each of the second sub-pixel SPX2 and the third sub-pixel SPX3 will be described in FIG. 4.

The second substrate 200 may include a second base substrate S2 and a common electrode CE. The second base substrate S2 may be an optically transparent insulation substrate.

The liquid crystal layer 300 is disposed between the first substrate 100 and the second substrate 200. The liquid crystal layer 300 may include liquid crystal molecules. The liquid crystal molecules may include a material having an orientation that is controlled by an electric field formed by the common electrode CE and the first pixel electrode PE1*a* and PE1*b*.

Figure 3B:
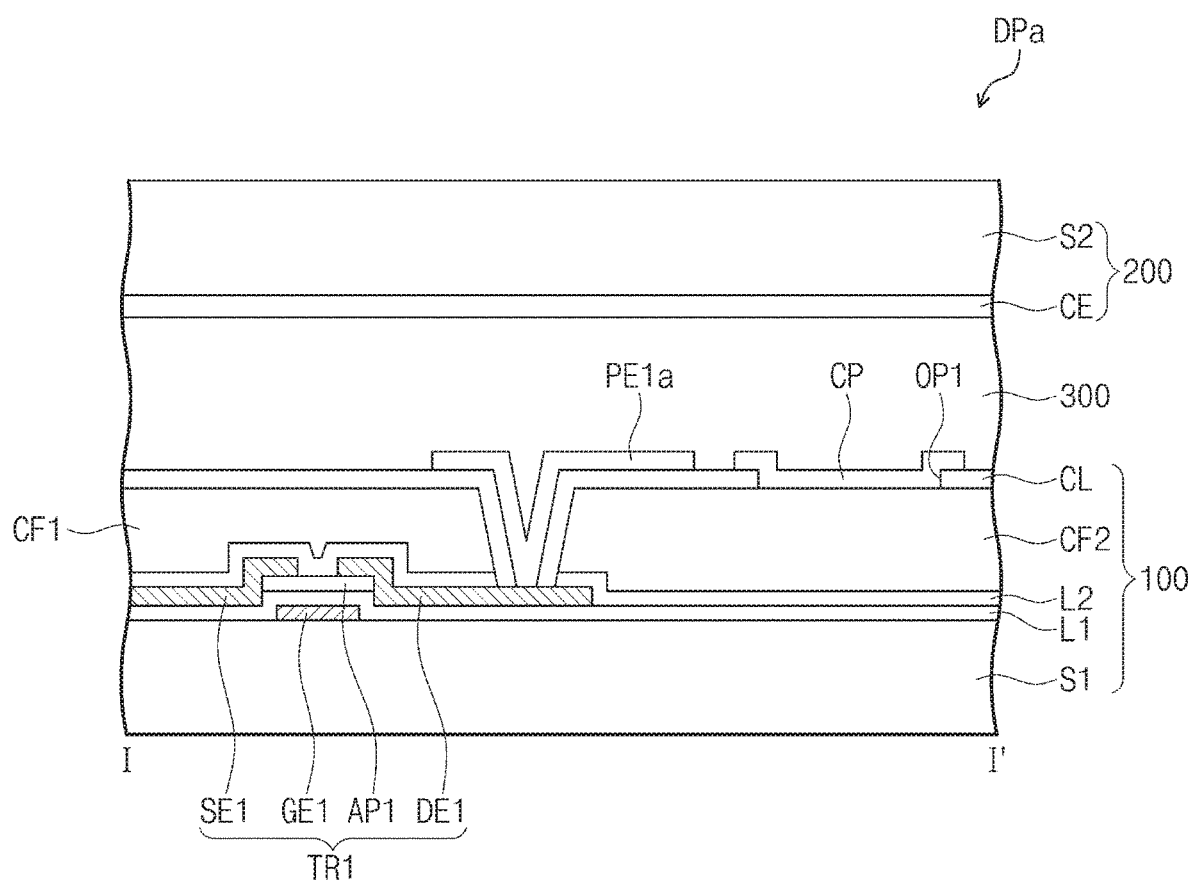
FIG. 3B is a cross-sectional view taken along line I-I' of FIG. 2 in accordance with another embodiment.

FIG. 3B is a cross-sectional view taken along line I-I' of FIG. 2 in accordance with another embodiment. In describing FIG. 3B, the same component as that described in FIG. 3A will be designated by the same reference symbol, and the overlapped component will not be described.

Referring to FIG. 3B, a display panel DPa further includes a cover pattern CP covering the first opening OP1. The cover pattern CP may prevent the second color filter CF2 from contacting the liquid crystal layer 300.

The cover pattern CP may include an organic material or an inorganic material. In an embodiment of the inventive concept, the cover pattern CP may contain the same material as a first high pixel electrode PE1*a*. The cover pattern CP may be formed simultaneously when the first high pixel electrode PE1*a* is formed.

Figure 4:
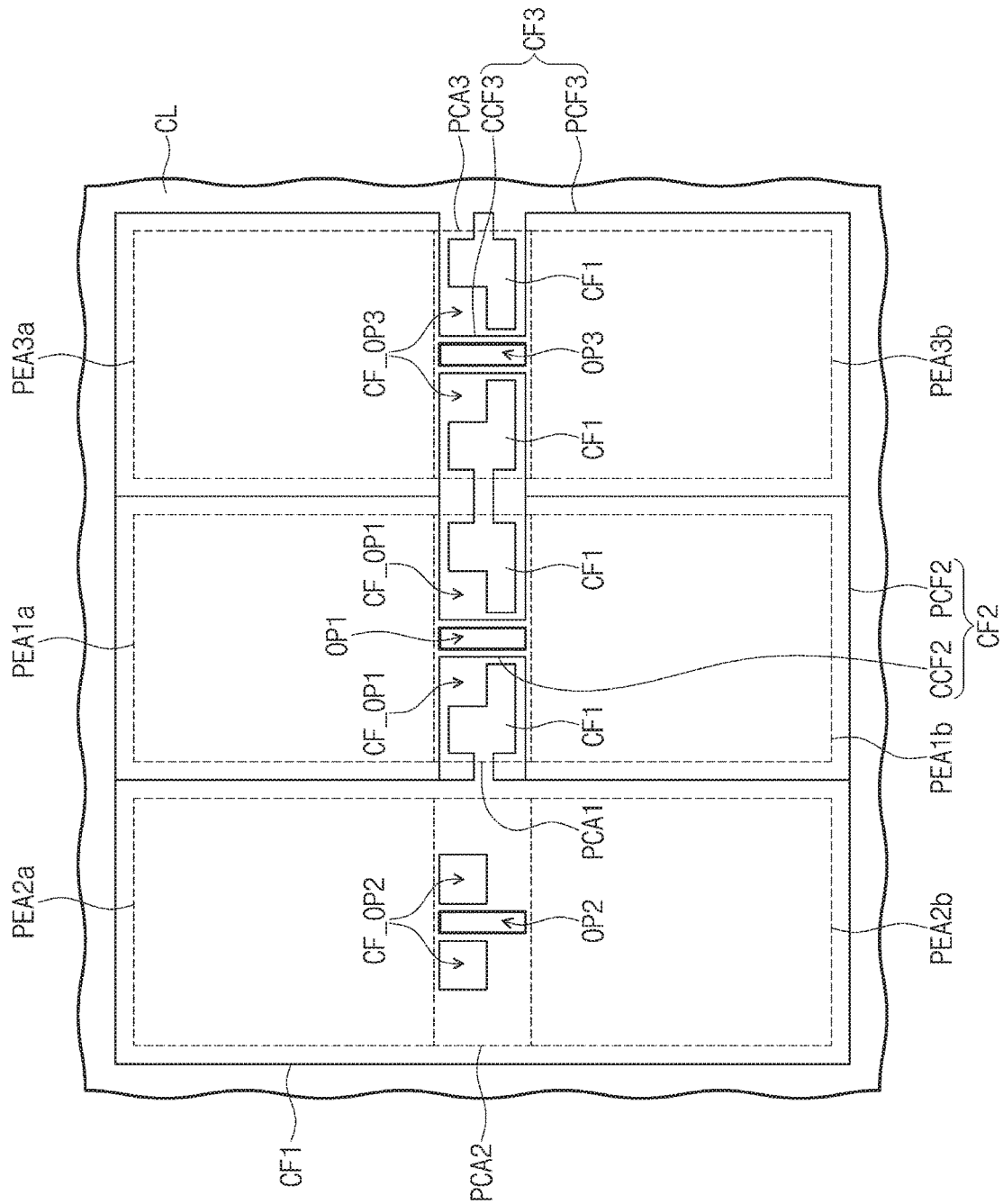
FIG. 4 is a plan view illustrating a color filter and a capping layer according to an embodiment of the inventive concept.

FIG. 4 is a plan view illustrating a color filter and a capping layer according to an embodiment of the inventive concept.

Referring to FIGS. 1 and 4, illustrated are the first pixel electrode areas PEA1*a* and PEA1*b* and the first pixel circuit area PCA1 of the first sub-pixel SPX1, second pixel electrode areas PEA2*a* and PEA2*b* and a second pixel circuit area PCA2 of the second sub-pixel SPX2, and third pixel electrode areas PEA3*a* and PEA3*b* and a third pixel circuit area PCA3 of the third sub-pixel SPX3.

The first sub-pixel SPX1 may be a green sub-pixel, the second sub-pixel SPX2 may be a red sub-pixel, and the third sub-pixel SPX3 may be a blue sub-pixel.

Although not shown, a second pixel electrode may be disposed on the second pixel electrode areas PEA2*a* and PEA2*b*, and pixel transistors connected to the second pixel electrode may be disposed on the second pixel circuit area PCA2. A third pixel electrode may be disposed on the third pixel electrode areas PEA3*a* and PEA3*b*, and pixel transistors connected to the third pixel electrode may be disposed on the third pixel circuit area PCA3. An arrangement relationship between the second and third pixel electrodes and the pixel transistors may be understood through the drawings in FIGS. 2 and 3A.

The second sub-pixel SPX2 may include the first color filter CF1. The first color filter CF1 may be a red color filter. The first color filter CF1 may be disposed on all of the second pixel electrode areas PEA2*a* and PEA2*b* and the second pixel circuit area PCA2. The first color filter CF1 disposed on the second pixel circuit area PCA2 may cover the pixel transistors of the second sub-pixel SPX2. The first color filter CF1 disposed on the second pixel electrode areas PEA2*a* and PEA2*b* may be disposed below the second pixel electrode.

Two openings CF_OP2 may be defined in the first color filter CF1 of the second sub-pixel SPX2. The two openings CF_OP2 are provided for connecting the second pixel electrodes to the pixel transistors.

A second opening OP2 may be defined in the capping layer CL disposed above the first color filter CF1 of the second sub-pixel SPX2. The second opening OP2 may be defined between the two openings CF_OP2 on a plane. A gas generated from the first color filter CF1 of the second sub-pixel SPX2 may be discharged through the second opening OP2.

The first sub-pixel SPX1 may be disposed adjacent to the second sub-pixel SPX2. The first sub-pixel SPX1 may include the first color filter CF1 and the second color filter CF2. The second color filter CF2 may be a green color filter.

For example, the first color filter CF1 may be disposed on the first pixel transistor TR1 (refer to FIG. 2) and the second pixel transistor TR2 (refer to FIG. 2). The first color filter CF1 of the first sub-pixel SPX1 may be connected to the first color filter CF1 of the second sub-pixel SPX2. Accordingly, a phenomenon, in which the first color filter CF1 of the first sub-pixel SPX1 is dropped out from the first substrate 100 (refer to FIG. 3A) during a process, may be prevented.

The second color filter CF2 may be disposed on the first pixel electrode areas PEA1*a* and PEA1*b* and the first pixel circuit area PCA1. The second color filter CF2 may include pixel color filters PCF2 disposed on the first pixel electrode areas PEA1*a* and PEA1*b* and connecting color filter CCF2 disposed on the first pixel circuit area PCA1. The connecting color filter CCF2 may connect the pixel color filters PCF2, which are spaced apart from each other, to each other. The connecting color filter CCF2 may be disposed on the peripheral portion of the first and second pixel transistors TR1 and TR2.

Openings CF_OP1, in which the color filters are not disposed, may be defined to connect the first pixel electrodes PE1*a* and PE1*b* (refer to FIG. 2) of the first sub-pixel SPX1 to the first and second pixel transistors TR1 and TR2. The openings CF_OP1 may correspond to an area in which the first and second color filters CF1 and CF2 are not provided.

The third sub-pixel SPX3 may be disposed adjacent to the first sub-pixel SPX1. The third sub-pixel SPX3 may include the first color filter CF1 and the third color filter CF3. The first color filter CF1 may be a red color filter, and the third color filter CF3 may be a blue color filter.

The first color filter CF1 may cover the pixel transistors of the third sub-pixel SPX3. The third color filter CF3 may be disposed on the third pixel electrode areas PEA3*a* and PEA3*b* and the third pixel circuit area PCA3.

The third color filter CF3 may include pixel color filters PCA3 disposed on the third pixel electrode areas PEA3*a* and PEA3*b* and connecting color filter CCF3 disposed on the third pixel circuit area PCA3. The connecting color filter CCF3 may connect the pixel color filters PCF3, which are spaced apart from each other, to each other. The connecting color filter CCF3 may be disposed on a peripheral portion of the pixel transistors of the third sub-pixel SPX3. The first color filter CF1 of the third sub-pixel SPX3 may be connected to the first color filter CF1 of the sub-pixel adjacent thereto.

Openings CF_OP3, in which the color filters are not disposed, may be defined for connecting the pixel electrodes of the third sub-pixel SPX3 to the pixel transistors. The openings CF_OP3 may correspond to an area in which the first and third color filters CF1 and CF3 are not provided.

A third opening OP3 may be defined in the capping layer CL disposed above the third color filter CF3 of the third sub-pixel SPX3. The third opening OP3 may overlap the third color filter CF3 on the plane. For example, the third opening OP3 may be disposed on the third pixel circuit area PCA3 and overlap the connecting color filter CCF3.

According to an embodiment of the inventive concept, the pixel transistors of each of the first to third sub-pixels SPX1, SPX2, and SPX3 are covered by the first color filter CF1. Accordingly, the light in the blue wavelength region, which heads toward the pixel transistors, may be blocked by the first color filter CF1. Accordingly, a phenomenon, in which a leakage current is generated in the pixel transistors by the light in the blue wavelength region, and a threshold voltage shift, may be prevented, and, as a result, degradation in the image quality of the display device DD may be prevented.

Also, the connecting color filters CCF2, CCF3 for connecting the pixel color filters PGF2, PCF3 disposed on the pixel electrode areas PEA1a, PEA1b and PEA3a, PEA3b are provided on the pixel circuit areas PCA1, PCA3 of each of the first and third sub-pixels SPX1 and SPX3, and the first and third openings OP1 and OP3 are provided in the capping layer CL covering the connecting color filters CCF2, CCF3, respectively. A gas, which is generated from the color filters CF2, CF3 disposed on the pixel electrode areas PEA1a, PEA1b and PEA3a, PEA3b of the first and third sub-pixels SPX1 and SPX3, may be discharged through the first and third openings OP1 and OP3, respectively. Thus, a detect, in which the liquid crystal layer 300 is not fully filled in an area corresponding to the pixel electrode areas PEA1a, PEA1b and PEA3a, PEA3b of the first and third sub-pixels SPX1 and SPX3, may be prevented, and, as a result, product reliability of the display device DD may be enhanced.

Figure 5:
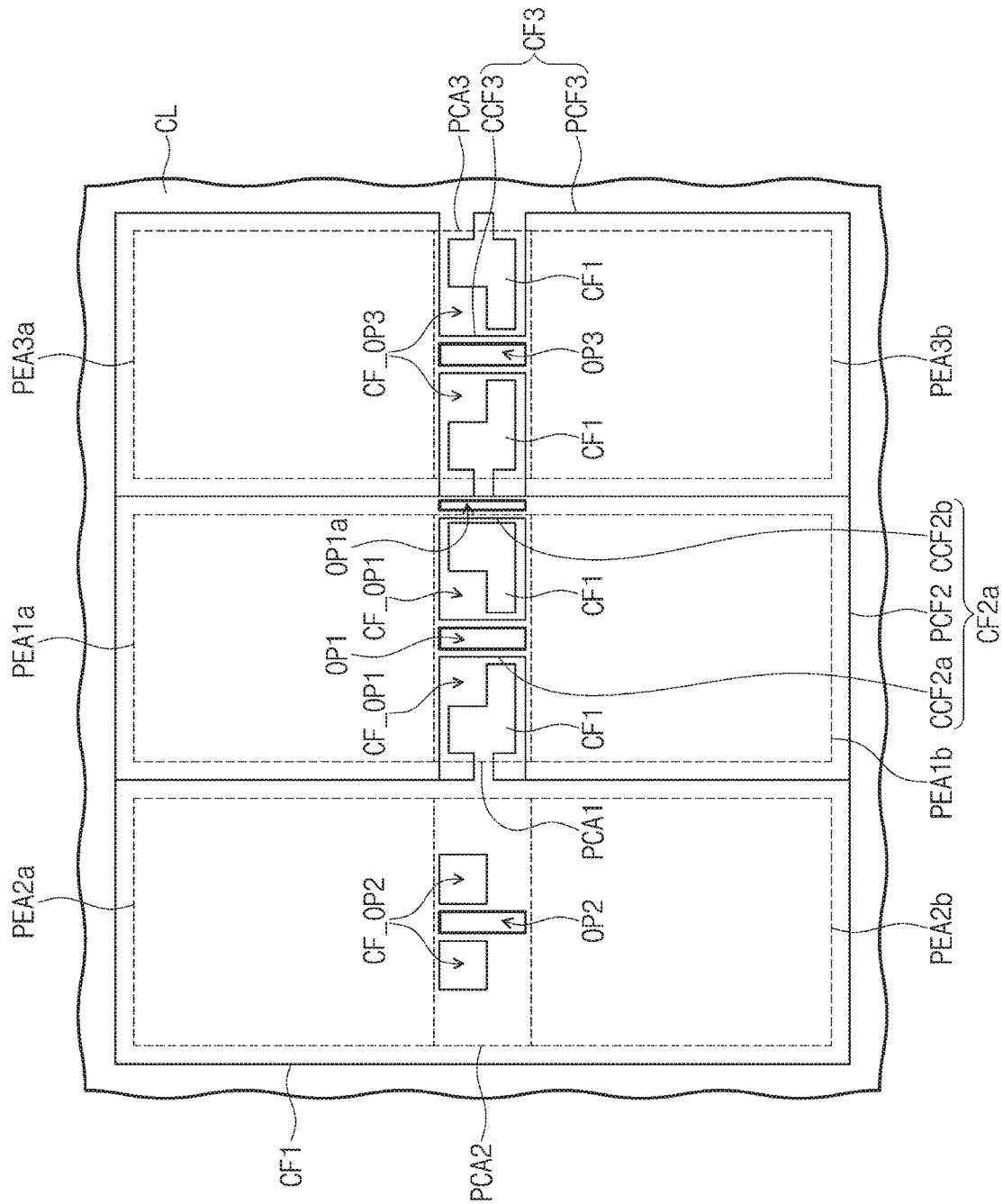
FIG. 5 is a plan view illustrating a color filter and a capping layer according to an embodiment of the inventive concept.

FIG. 5 is a plan view illustrating a color filter and a capping layer according to an embodiment of the inventive concept. In describing FIG. 5, the same component as that described in FIG. 4 will be designated by the same reference symbol, and description regarding this will be omitted.

Referring to FIGS. 1 and 5, the first sub-pixel SPX1 includes a first color filter CF1 and a second color filter CF2a.

The second color filter CF2a may include pixel color filters PGF2 disposed on first pixel electrode areas PEA1a and PEA1b and connecting color filters CCF2a and CCF2b disposed on the first pixel circuit area PCA1. The connecting color filters CCF2a and CCF2b may be spaced apart from each other. The first color filter CF1 covering a pixel transistor may be disposed between the connecting color filters CCF2a and CCF2b. That is, the second pixel transistor TR2 (refer to FIG. 2) may be disposed between the connecting color filters CCF2a and CCF2b on a plane.

The capping layer CL covers the first color filter CF1 and the second color filter CF2a. First openings OP1 and OP1a may be defined in an area overlapping the connecting color filters CCF2a and CCF2b of the capping layer CL. The first opening OP1 may be disposed above the connecting color filter CCF2a, and the first opening OP1b may be disposed above the connecting color filter CCF2b.

The connecting color filter may be provided in plurality on a specific sub-pixel. For example, a gas generation amount of each of the color filters may be measured, and then, on the basis of the measurement, the number of the connecting color filters may be determined.

For example, a gas generation amount of each of the second color filter CF2a and the third color filter CF3 is analyzed. The gas generation amount of the second color filter CF2a may be greater than that of the third color filter CF3. Accordingly, in order to further easily discharge a gas of the second color filter CF2a, which has more gas generation amount, the connecting color filter CCF2b may be further added, and the first opening OP1a may be added thereabove.

Figure 6:
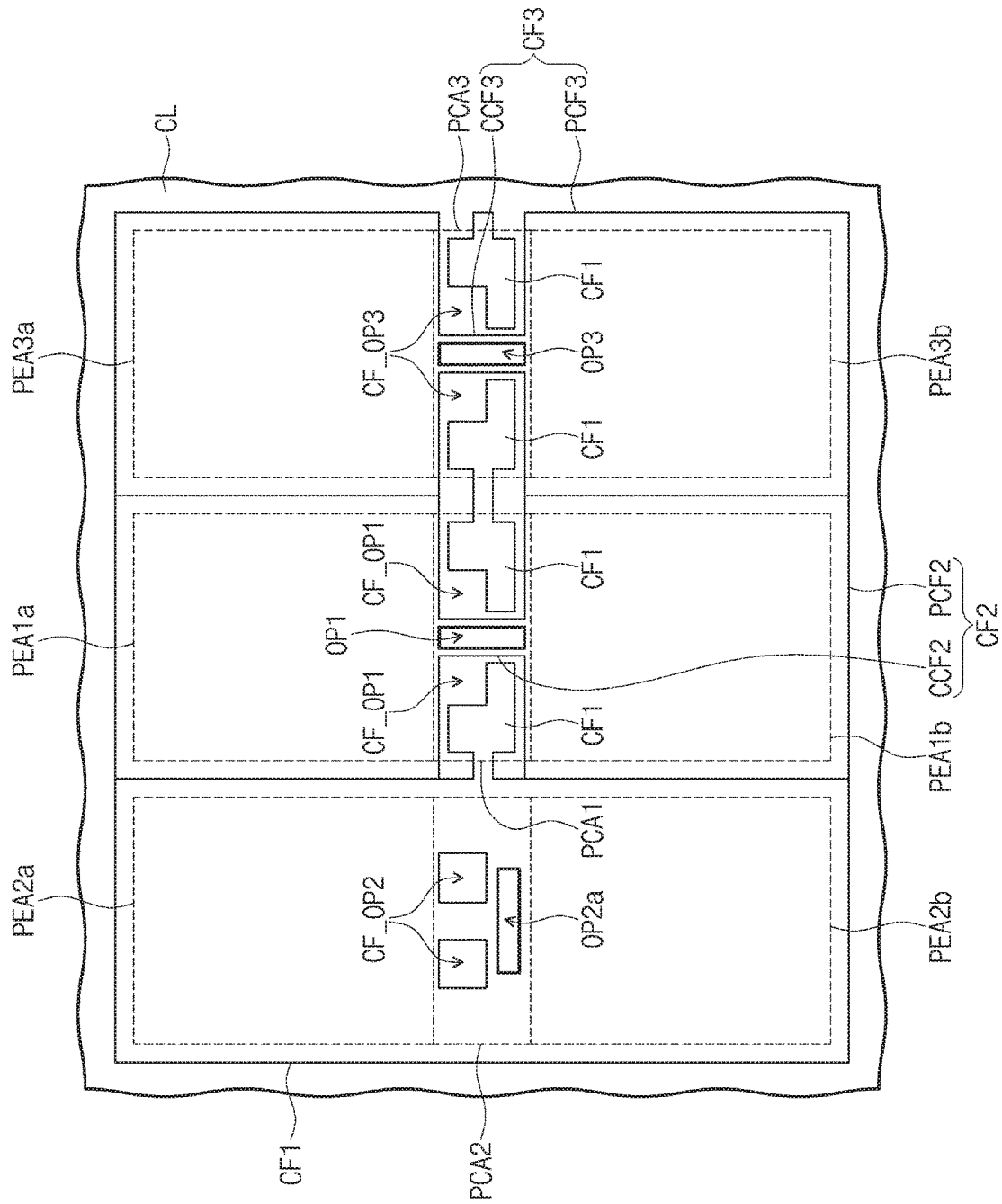
FIG. 6 is a plan view illustrating a color filter and a capping layer according to an embodiment of the inventive concept.

FIG. 6 is a plan view illustrating a color filter and a capping layer according to an embodiment of the inventive concept. In describing FIG. 6, the same component as that described in FIG. 4 will be designated by the same reference symbol, and description regarding this will be omitted.

Referring to FIGS. 1 and 6, the second sub-pixel SPX2 may emit red light to provide a red image.

The second sub-pixel SPX2 may include only a first color filter CF1. The first color filter CF1 of the second sub-pixel SPX2 may be disposed on all of the second pixel electrode areas PEA2a and PEA2b and the second pixel circuit area PCA2.

A second opening OP2a overlapping the first color filter CF1 may be defined in the capping layer CL covering the first color filter CF1. Since only the first color filter CF1 is disposed on the second pixel circuit area PCA2, the degree of freedom in design on a position or a shape of the second opening OP2a may increase. For example, the second opening OP2 (refer to FIG. 4) may be defined in the same position as the first opening OP1 (refer to FIG. 4) as illustrated in FIG. 4, and disposed below the opening CF_OP2 as illustrated in FIG. 6.

Figure 7:
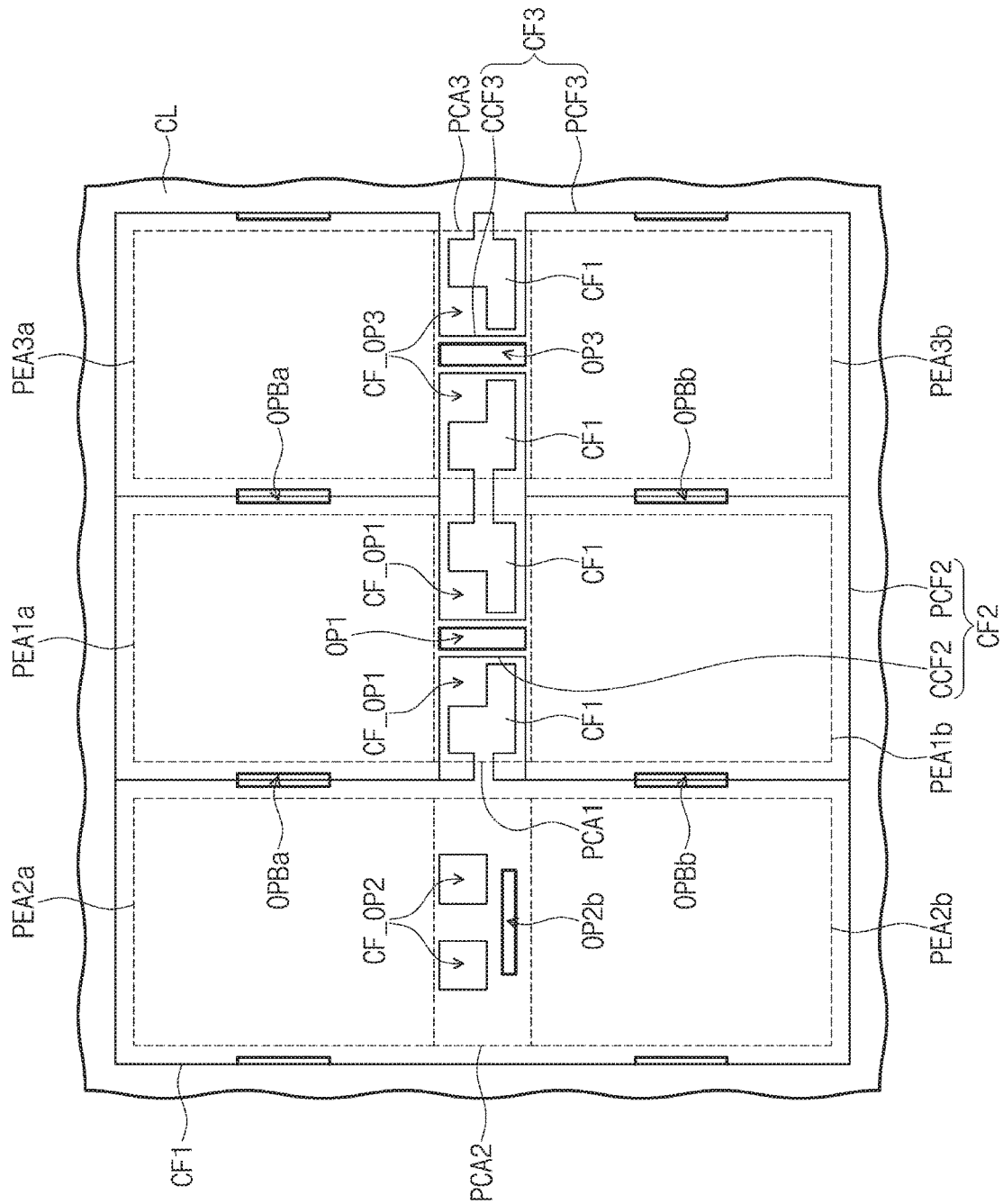
FIG. 7 is a plan view illustrating a color filter and a capping layer according to an embodiment of the inventive concept.

FIG. 7 is a plan view illustrating a color filter and a capping layer according to an embodiment of the inventive concept. In describing FIG. 7, the same component as that described in FIG. 4 will be designated by the same reference symbol, and description regarding this will be omitted.

Referring to FIGS. 1 and 7, a first opening OP1, a second opening OP2b, a third opening OP3, first boundary openings OPBa, and second boundary openings OPBb may be defined in a capping layer CL.

The first opening OP1 may be defined in an area overlapping a connecting color filer CCF2 of the first sub-pixel SPX1, the second opening OP2b may be defined in a second pixel circuit area PCA2 of the second sub-pixel SPX2, and the third opening OP3 may be defined in an area overlapping a connecting color filter CCF3 of the third sub-pixel SPX3.

The first boundary openings OPBa and the second boundary openings OPBb may be defined in a boundary portion between two color filters.

The first boundary openings OPBa may overlap a boundary portion between two color filters disposed on high pixel electrode areas, and the second boundary openings OPBb may overlap a boundary portion between two color filters disposed on low pixel electrode areas.

According to an embodiment of the inventive concept, a gas generated from the color filters disposed adjacent to each other may be discharged through one first boundary opening OPBa and/or one second boundary opening OPBb.

For example, a gas generated from the first color filter CF1 and the second color filter CF2 may be discharged through the first boundary opening OPBa overlapping the area between the first high pixel electrode area PEA1a and the second high pixel electrode area PEA2a. Also, a gas generated from the second color filter CF2 and the third color filter CF3 may be discharged through the first boundary opening OPBa overlapping the area between the first high pixel electrode area PEA1a and the third high pixel electrode area PEA3a.

According to an embodiment of the inventive concept, when compared with FIG. 4, the first boundary openings OPBa and the second boundary openings OPBb are further provided. Accordingly, the gas generated from the first to third color filters CF1, CF2, and CF3 may be smoothly discharged.

As the first boundary openings OPBa and the second boundary openings OPBb are additionally provided, the degree of freedom in design for sizes of the first opening OP1, the second opening OP2b, and the third opening OP3 may increase. For example, the first opening OP1, the second opening OP2b, and the third opening OP3 may decrease in size, or the first opening OP1, the second opening OP2b, and the third opening OP3 may be omitted.

Figure 8:
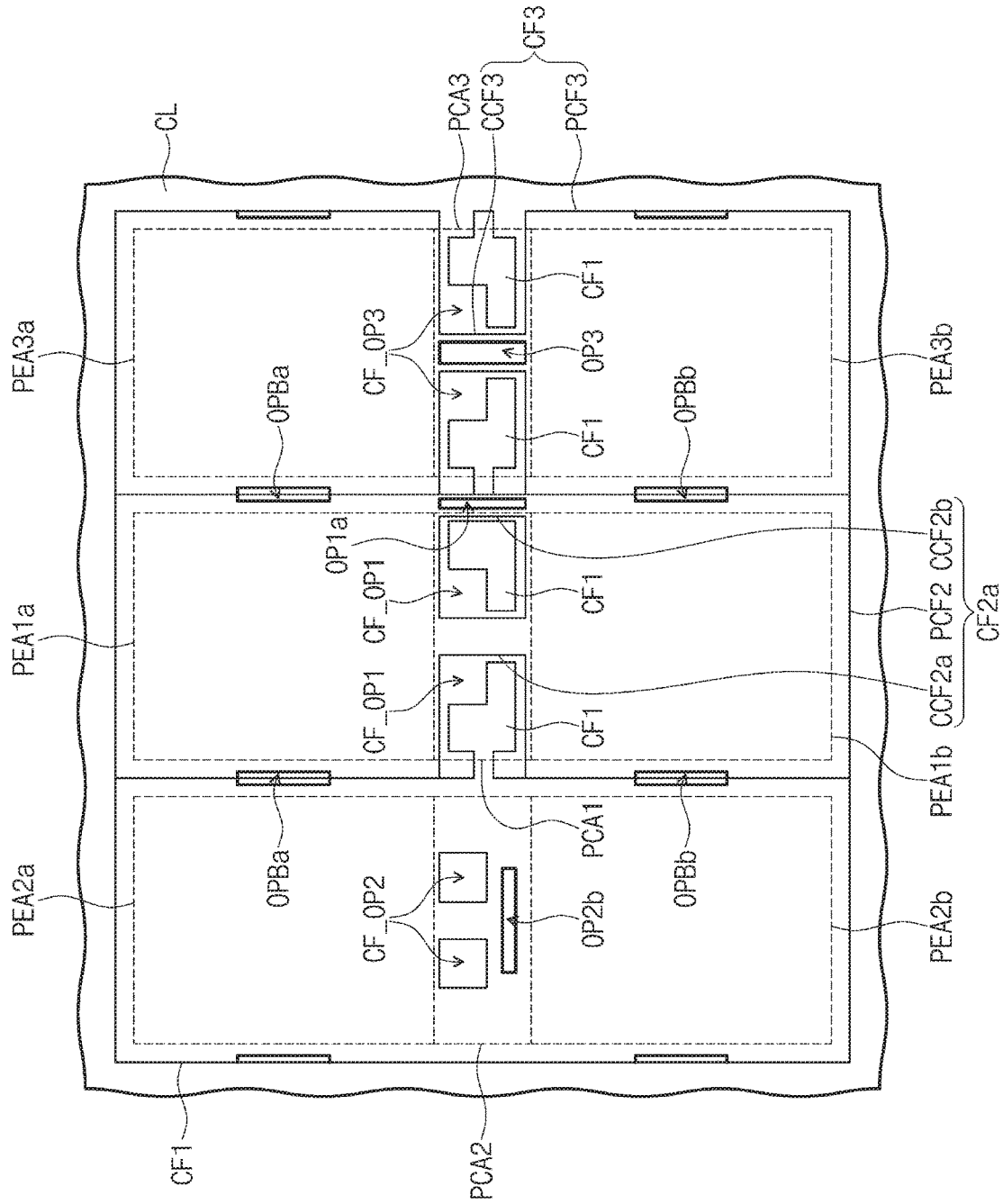
FIG. 8 is a plan view illustrating a color filter and a capping layer according to an embodiment of the inventive concept.

FIG. 8 is a plan view illustrating a color filter and a capping layer according to an embodiment of the inventive concept.

Referring to FIG. 8, a first opening OP1a, a second opening OP2b, a third opening OP3, first boundary openings OPBa, and second boundary openings OPBb may be defined in the capping layer CL.

When compared with FIG. 5, first boundary openings OPBa and second boundary openings OPBb are further provided. Accordingly, a gas generated from first to third color filters CF1, CF2, and CF3 may be further smoothly discharged. Accordingly, the first opening OP1a may be provided to only an area overlapping at least one of two connecting color filters CCF2a and CCF2b. FIG. 8 illustrates an example in which the first opening OP1a is provided to an area overlapping the connecting color filter CCF2b of the first sub-pixel SPX1. However, the embodiment of the inventive concept is not limited thereto. For example, the first opening OP1a may be provided to an area overlapping the connecting color filter CCF2a.

Figure 9:
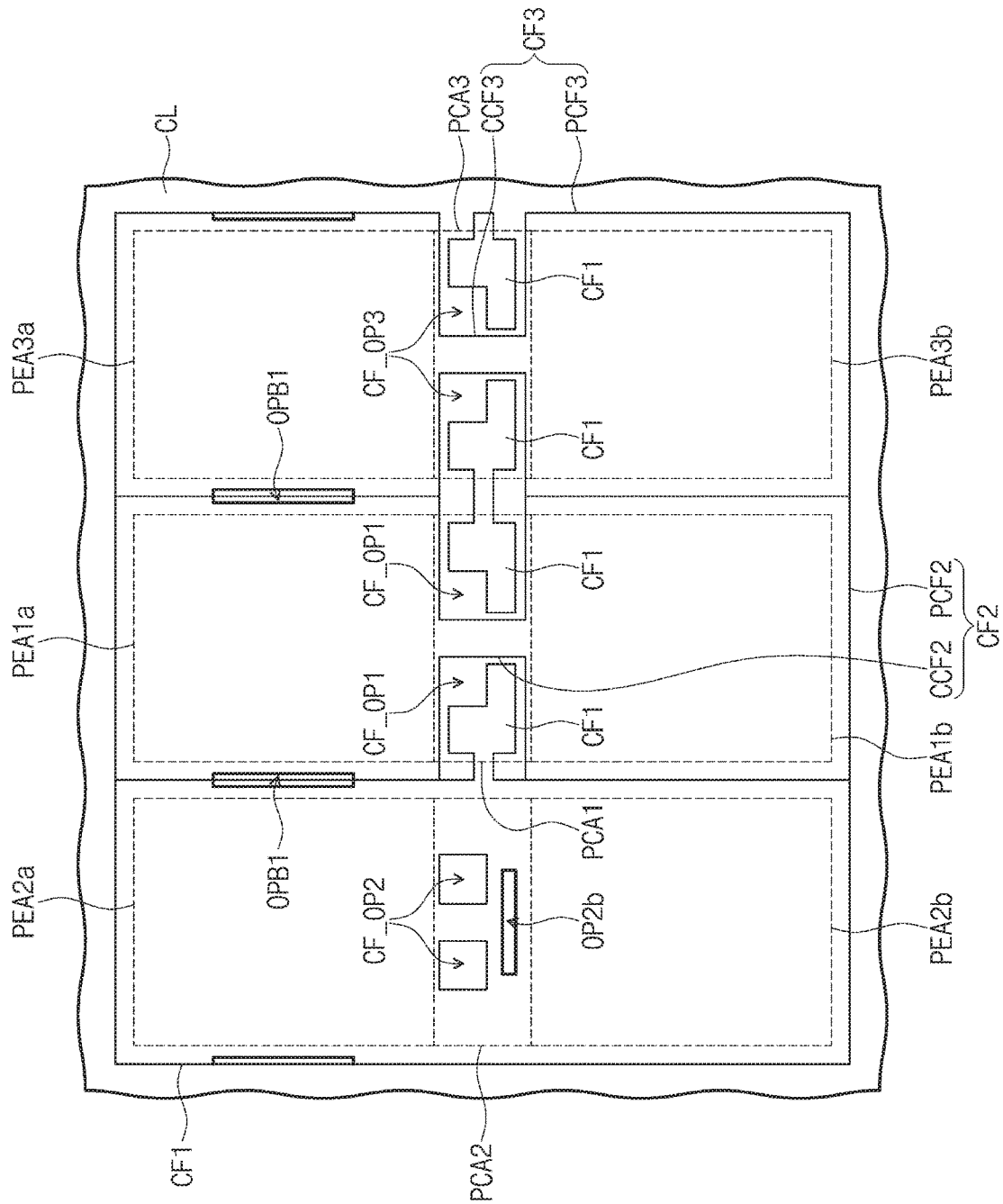
FIG. 9 is a plan view illustrating a color filter and a capping layer according to an embodiment of the inventive concept.

FIG. 9 is a plan view illustrating a color filter and a capping layer according to an embodiment of the inventive concept.

Referring to FIG. 9, a second opening OP2b and boundary openings OPB1 may be defined in the capping layer CL.

The boundary openings OPB1 may overlap a boundary portion between two color filters disposed on high pixel electrode areas. However, the embodiment of the inventive concept is not limited thereto. For example, the boundary openings OPB1 may overlap a boundary portion between two color filters disposed on low pixel electrode areas.

When compared with FIG. 7, in FIG. 9, the boundary openings OPB1 overlaps only one boundary of high pixel electrode areas and low pixel electrode areas. Also, each of the boundary openings OPB1 may be greater in length than each of the first boundary openings OPBa in FIG. 7.

In an embodiment of FIG. 9, openings overlapping the connecting color filters CCF2 and CCF3 may be omitted. When a gas is generated from the color filters disposed on the lower pixel electrode areas, e.g., the first low pixel electrode area PEA1b and the third low pixel electrode area PEA3b, the gas may move through the connecting color filters CCF2 and CCF3 and be discharged to the boundary openings OPB1.

Also, in another embodiment of the inventive concept, the second opening OP2b also may be omitted. Also, in another embodiment of the inventive concept, openings overlapping the connecting color filters CCF2 and CCF3 may be defined in the capping layer CL.

FIG. 10 is a plan view illustrating a color filter and a capping layer according to an embodiment of the inventive concept.

When compared with FIG. 9, a first opening OP1a is further provided in the capping layer CL in FIG. 10. Each of the color filters may be different in gas generation amount. Accordingly, in consideration of this, an opening may be additionally defined in the color filter that has more gas generation amount.

According to the embodiment of the inventive concept, the pixel transistors of each of the red, blue, and green sub-pixels are covered by the red color filter. The blue light may be blocked from being incident into the pixel transistors by the red color filter. Accordingly, the deterioration of the characteristics of the pixel transistors caused by the blue light may be prevented. Also, the blue or green color filter may be disposed on the peripheral portion of the pixel transistors of the blue or green sub-pixel, and the opening may be defined in the capping layer covering the blue or green color filter. Thus, the gas generated from the blue or green color filter may be discharged through the opening.

Resultantly, the defect in which the liquid crystal layer is not filled in the area corresponding to the blue and green sub-pixels may be prevented.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed. Hence, the real protective scope of the inventive concept shall be determined by the technical scope of the accompanying claims.

What is claimed is:

1. A display device comprising a display panel comprising:
   a pixel comprising a first sub-pixel and a second sub-pixel; and
   a capping layer,
   wherein the first sub-pixel comprises:
   a first pixel transistor disposed on a first pixel circuit area;
   a first pixel electrode disposed on a first pixel electrode area;
   a first color filter disposed on the first pixel circuit area while covering the first pixel transistor; and
   a second color filter disposed on the first pixel electrode area and the first pixel circuit area and being different from the first color filter, and
   the capping layer covers the first color filter and the second color filter, and a first opening is defined in one area of the capping layer, which overlaps the second color filter on a plane.

2. The display device of claim 1, wherein the second sub-pixel comprises:
   a second pixel transistor disposed on a second pixel circuit area;
   a second pixel electrode disposed on a second pixel electrode area; and
   a third color filter disposed on the second pixel circuit area and the second pixel electrode area while covering the second pixel transistor.

3. The display device of claim 2, wherein the first color filter is the same as the third color filter.

4. The display device of claim 2, wherein each of the first color filter and the third color filter is a red color filter.

5. The display device of claim 1, wherein the second color filter is disposed around the first color filter on the first pixel circuit area, and non-overlaps the first pixel transistor on the plane.

6. The display device of claim 1, wherein each of the first pixel electrode area and the first pixel transistor is provided in plurality, and the first pixel circuit area is disposed between the first pixel electrode areas,
   the second color filter comprises pixel color filters and at least one connecting color filter connecting the pixel color filters, and
   the pixel color filters are disposed on the first pixel electrode areas, and the connecting color filter is disposed on the first pixel circuit area.

7. The display device of claim 6, wherein the first opening overlaps one of the pixel color filters.

8. The display device of claim 6, wherein the first opening is provided in plurality, and the first openings overlap the pixel color filters.

9. The display device of claim 6, wherein the first opening overlaps the connecting color filter.

10. The display device of claim 6, wherein the connecting color filter is provided in plurality, and the first pixel transistor is disposed between the connecting color filters on the plane.

11. The display device of claim 1, wherein the display panel further comprises a cover pattern covering the first opening.

12. The display device of claim 1, wherein the second color filter is a green color filter.

13. The display device of claim 1, wherein the pixel further comprises a third sub-pixel, and
the third sub-pixel comprises:
a third pixel transistor disposed on a third pixel circuit area;
a third pixel electrode disposed on a third pixel electrode area; and
a fourth color filter disposed on the third pixel electrode area and the third pixel circuit area,
the first color filter is also disposed on the third pixel circuit area while covering the third pixel transistor, and
the capping layer covers the first color filter and the fourth color filter, and a second opening is defined in one area of the capping layer, which overlaps the fourth color filter on the plane.

14. The display device of claim 13, wherein the fourth color filter is a blue color filter.

15. A display device comprising a display panel comprising: a pixel comprising a red sub-pixel, a blue sub-pixel, and a green sub-pixel; and a capping layer,
wherein each of the red, blue, and green sub-pixels comprises a pixel transistor disposed on a pixel circuit area and a pixel electrode disposed on a pixel electrode area, and the pixel transistor is covered by a red color filter,
a blue color filter is disposed on a first peripheral portion of the pixel transistor on the pixel circuit area of the blue sub-pixel and the pixel electrode area of the blue sub-pixel,
a green color filter is disposed on a second peripheral portion of the pixel transistor on the pixel circuit area of the green sub-pixel and the pixel electrode area of the green sub-pixel, and
openings are provided in the capping layer, and the openings overlap the red color filter, the green color filter, and the blue color filter, respectively.

16. The display device of claim 15, wherein at least one of the openings overlaps the first peripheral portion on a plane, and at least one of the openings overlaps the second peripheral portion on the plane.

17. The display device of claim 15, wherein at least one of the openings overlaps a third peripheral portion of the pixel transistor on the pixel circuit area of the red sub-pixel.

18. The display device of claim 15, wherein at least one of the openings overlaps two color filters, which are adjacent to each other, of the red color filter, the blue color filter, and the green color filter.

19. The display device of claim 15, wherein the pixel electrode area of each of the red sub-pixel, the blue sub-pixel, and the green sub-pixel is provided in plurality, and the pixel circuit area is disposed between pixel electrode areas,
the blue color filter comprises blue pixel color filters disposed on the pixel electrode areas of the blue sub-pixel and a blue connecting color filter disposed on the first peripheral portion,
the green color filter comprises green pixel color filters disposed on the pixel electrode areas of the green sub-pixel and a green connecting color filter disposed on the second peripheral portion, and
the blue pixel color filters are connected by the blue connecting color filter, and the green pixel color filters are connected by the green connecting color filter.

20. The device of claim 19, wherein the green connecting color filter is provided in plurality, and the green pixel color filters are connected by the plurality of green connecting color filters.

* * * * *